(12) United States Patent
Iida

(10) Patent No.: US 8,411,188 B2
(45) Date of Patent: Apr. 2, 2013

(54) SOLID-STATE IMAGE PICKUP DEVICE

(75) Inventor: Satoko Iida, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/280,189

(22) Filed: Oct. 24, 2011

(65) Prior Publication Data

US 2012/0105695 A1     May 3, 2012

(30) Foreign Application Priority Data

Oct. 29, 2010   (JP) ................................. 2010-244263

(51) Int. Cl.
*H04N 5/335*     (2011.01)
(52) U.S. Cl. ....................... 348/308; 348/294; 250/208.1
(58) Field of Classification Search .................. 348/308, 348/294; 250/208.1; 257/291, 292
See application file for complete search history.

(56) References Cited

U.S. PATENT DOCUMENTS

| 5,892,540 | A | * | 4/1999 | Kozlowski et al. | 348/300 |
| 6,128,039 | A | * | 10/2000 | Chen et al. | 348/294 |
| 6,166,769 | A | * | 12/2000 | Yonemoto et al. | 348/308 |
| 2005/0168603 | A1 | | 8/2005 | Hiyama | |
| 2009/0273392 | A1 | * | 11/2009 | Korobeynikov et al. | 327/551 |

FOREIGN PATENT DOCUMENTS

| EP | 813338 A2 | 12/1997 |
| JP | 2008-78894 A | 4/2008 |

OTHER PUBLICATIONS

U.S. Appl. No. 13/217,024, filed Aug. 24, 2011.
U.S. Appl. No. 13/158,266, filed Jun. 10, 2011.
U.S. Appl. No. 13/076,364, filed Mar. 30, 2011.
U.S. Appl. No. 13/033,332, filed Feb. 23, 2011.
U.S. Appl. No. 13/033,376, filed Feb. 23, 2011.
U.S. Appl. No. 13/029,046, filed Feb. 16, 2011.
U.S. Appl. No. 13/032,868, filed Feb. 23, 2011.
U.S. Appl. No. 13/021,468, filed Feb. 4, 2011.

* cited by examiner

*Primary Examiner* — Tuan Ho
*Assistant Examiner* — Zhenzhen Wu
(74) *Attorney, Agent, or Firm* — Canon U.S.A., Inc. IP Division

(57) ABSTRACT

A solid-state image pickup device includes a pixel including a photoelectric conversion element that converts light into an electric signal, a feedback amplifying circuit that amplifies a signal of the pixel using an amplification factor that is based on a variable feedback capacitor, a storage capacitor connected to an output node of the amplifying circuit via a first switch, and a load element connected to the output node of the amplifying circuit via a second switch. The second switch is in an on state during any one of or both of a period in which the feedback capacitor is reset and a period in which the first switch is in an on state.

7 Claims, 12 Drawing Sheets

SOLID-STATE IMAGE PICKUP DEVICE

BACKGROUND OF THE INVENTION

1. Field of the Invention

The present invention relates to solid-state image pickup devices used for digital still cameras, digital video cameras, or the like.

2. Description of the Related Art

In typical solid-state image pickup devices, electric signals that are generated through photoelectric conversion performed in a plurality of pixels arranged in a two-dimensional matrix are transmitted to a signal processing circuit in the subsequent stage via amplifiers provided in the respective columns. In recent years, there has been a demand for solid-state image pickup devices to have more pixels and to operate at higher speed, so that the bandwidth set in each amplifier has tended to be wide. Such an increase in signal bandwidth leads to an increase in the integral value of random noise, which is proportional to the signal bandwidth of the amplifier. Japanese Patent Laid-Open No. 2008-78894 describes a configuration in which a capacitor is connected to an amplifier when clamping the reference potential of the amplifier. As a result of clamping the reference potential of the amplifier by connecting a capacitor to the output end of the amplifier, the bandwidth of the amplifier is limited. Accordingly, random noise generated from the amplifier is reduced.

In a solid-state image pickup device having a plurality of amplifiers, for example, amplifiers provided in individual columns, the amplification factor of the amplifiers may be changed in various ways in accordance with the intended application. For example, driving for capturing an image having a wide dynamic range in which a dark subject and a light subject exist may be performed. Also, driving for securing a dynamic range in each of an addition mode and a non-addition mode, and driving for changing the amplification factor of signals in individual pixels of individual colors may be performed. In such driving operations, the amplification factors of amplifiers range from minus several dB to several tens of dB. However, in the case of changing the amplification factors of amplifiers in accordance with an image capturing condition, the driving method according to Japanese Patent Laid-Open No. 2008-78894 does not always sufficiently reduce random noise generated from the amplifiers. This is because, in the method described in Japanese Patent Laid-Open No. 2008-78894, a frequency band is limited by a feedback capacitor that determines an amplification factor of an amplifier and a signal storage capacitor connected to an output end of the amplifier. For this reason, the frequency band of the amplifier becomes wider as the amplification factor decreases with a small feedback capacitance, and random noise increases in proportion to the frequency bandwidth. In other words, random noise generated from the amplifier is not always sufficiently reduced depending on an amplification factor that is set.

SUMMARY OF THE INVENTION

The present invention provides a solid-state image pickup device capable of reducing random noise generated from an amplifying circuit and improving a signal-to-noise (S/N) ratio.

A solid-state image pickup device according to an aspect of the present invention includes a pixel including a photoelectric conversion element that converts light into an electric signal, a feedback amplifying circuit that amplifies a signal of the pixel using an amplification factor that is based on a variable feedback capacitor, a storage capacitor connected to an output node of the amplifying circuit via a first switch, and a load element connected to the output node of the amplifying circuit via a second switch. The second switch is in an on state during any one of or both of a period in which the feedback capacitor is reset and a period in which the first switch is in an on state.

Further features of the present invention will become apparent from the following description of exemplary embodiments with reference to the attached drawings.

DESCRIPTION OF THE EMBODIMENTS

First Embodiment

Figure 1:
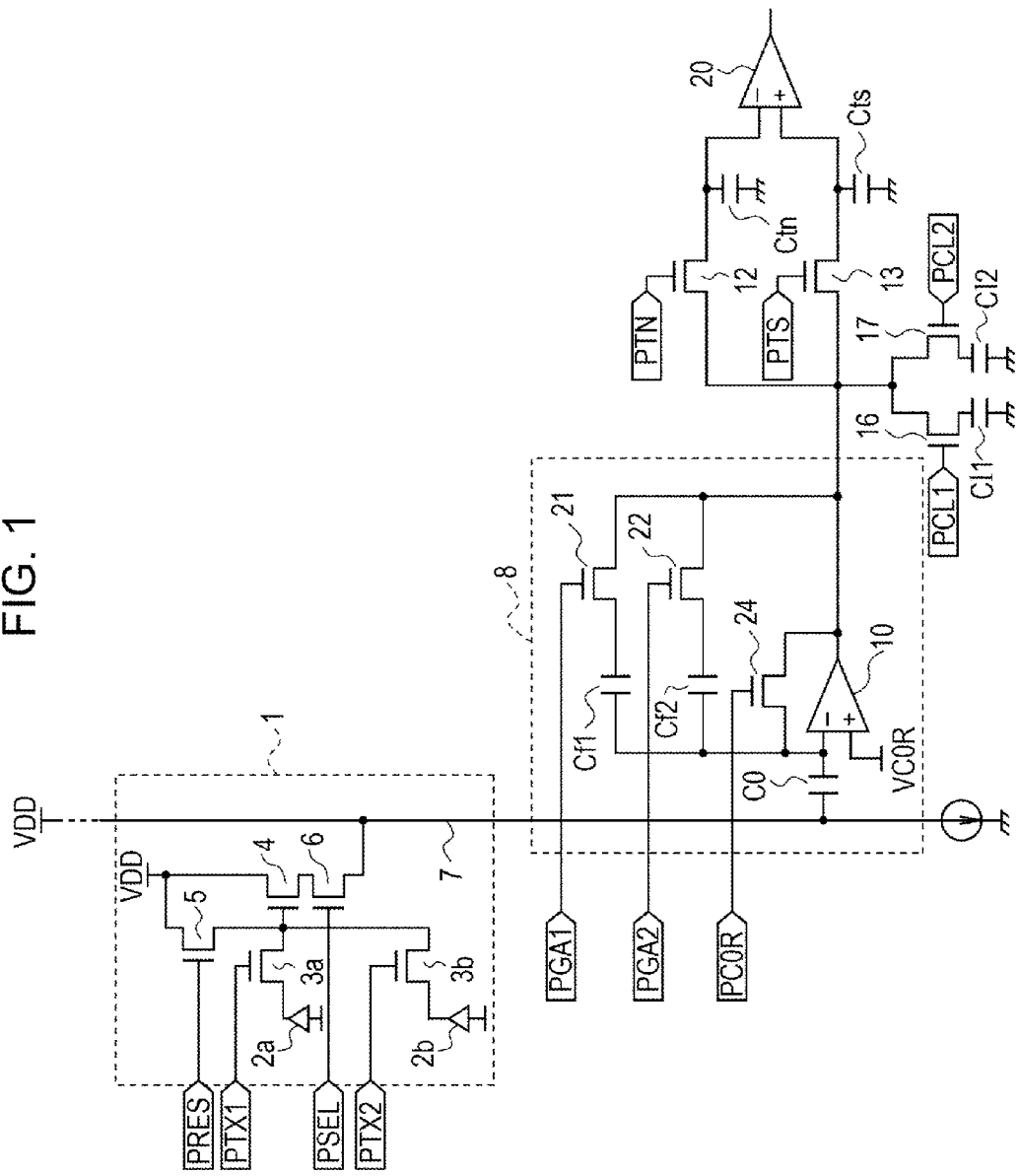
FIG. 1 is an equivalent circuit diagram of a solid-state image pickup device according to first to third embodiments of the present invention.

FIG. 1 is an equivalent circuit diagram of a pixel section and a readout circuit for one column of a solid-state image pickup device according to a first embodiment of the present invention. As for the pixel section, pixels in two rows and one column among a plurality of pixels that are two-dimensionally arranged are illustrated. The pixel section 1 includes photoelectric conversion elements 2a and 2b, transfer transistors 3a and 3b, a source follower transistor 4, a reset transistor 5, and a row-selection transistor 6. Metal-oxide semiconductor (MOS) transistors may be used as these transistors. Hereinafter, the transfer transistors 3a and 3b are referred to as transfer MOSs 3a and 3b, the source follower transistor 4 is referred to as an SFMOS 4, the reset transistor 5 is referred to as a reset MOS 5, and the row-selection transistor 6 is referred to as a row-selection MOS 6. The photoelectric conversion elements 2a and 2b are photodiodes, for example, which are provided in the pixel section 1, and convert light into electric signals through photoelectric conversion. The transfer MOSs 3a and 3b transfer signals generated by the photoelectric conversion elements 2a and 2b to the input node of the SFMOS 4. The SFMOS 4 amplifies the signals transferred by the transfer MOSs 3a and 3b. The reset MOS 5 resets the gate voltage of the SFMOS 4 to a certain potential. The row-selection MOS 6 controls the electrical connection between the source of the SFMOS 4 and a vertical output line 7. In this embodiment, the SFMOS 4, the reset MOS 5, and the row-selection MOS 6 are shared by the two photoelectric conversion elements 2a and 2b. Alternatively, a certain transistor may be shared by a larger number of photoelectric conversion elements. Also, the row-selection MOS 6 may be provided between a VDD and the drain of the SFMOS 4. Instead of providing the row-selection MOS 6, the gate potential of the SFMOS 4 may be controlled by the reset MOS 5 to select a row, for example. In addition, the gate of the SFMOS 4 may be electrically connected to a floating diffusion region.

The vertical output line 7 is electrically connected to an amplifying circuit unit 8. The amplifying circuit unit 8 includes a feedback amplifying circuit, and amplifies signals output from the pixel section 1 to the vertical output line 7 at an amplification factor that depends on variable capacitance values of feedback capacitors Cf1 and Cf2. The amplifying circuit unit 8 includes a clamp capacitor C0, an inverting amplifier 10, the feedback capacitors Cf1 and Cf2, amplification factor selection switches 21 and 22, and a clamp switch 24. For example, MOS transistors may be used as the amplification factor selection switches 21 and 22. The amplifying circuit unit 8 is capable of changing an amplification factor by selecting the feedback capacitor Cf1 or Cf2 by switching the amplification factor selection switch 21 or 22. A reference potential VC0R is applied to a non-inverting input node of the inverting amplifier 10. When the level of a clamp pulse PC0R input to the gate of the clamp switch 24 becomes high, both ends of the feedback capacitor Cf1 or Cf2 are short circuited. Accordingly, the potential difference between the reference potential VC0R and the vertical signal line 7 is stored in the clamp capacitor C0.

The output node of the amplifying circuit unit 8 is connected to a storage capacitor Ctn via a control switch (first switch) 12. Also, the output node of the amplifying circuit unit 8 is connected to a storage capacitor Cts via a control switch (first switch) 13. The storage capacitor Ctn stores a dark-time signal (almost equal to VC0R), which is the potential of the vertical output line 7 with respect to the reference potential VC0R at the time of resetting performed by the reset MOS 5. Here, the dark-time signal is a so-called noise signal of a pixel. The storage capacitor Cts stores a signal obtained by superimposing a dark-time signal on a photoelectric conversion signal generated by the photoelectric conversion element 2a or 2b. Also, the output node of the amplifying circuit unit 8 is connected to a load capacitor Cl1 via a control switch (second switch) 16. Also, the output node of the amplifying circuit unit 8 is connected to a load capacitor Cl2 via a control switch (second switch) 17. The control switches 16 and 17 are controlled in conjunction with the amplification factor of the amplifying circuit unit 8 for a certain period. That is, the capacitance value of a connected load capacitor changes depending on an amplification factor. Furthermore, the signals stored in the storage capacitors Ctn and Cts are sequentially read out by a horizontal scanning circuit. More specifically, switches (not illustrated) provided in the subsequent stages of the storage capacitors Ctn and Cts are sequentially scanned by the horizontal scanning circuit, so that signals are read out to a horizontal output line. An output amplifier 20, which is provided along the horizontal output line as necessary, calculates the difference between the signal of the storage capacitor Cts and the signal of the storage capacitor Ctn, and outputs a pixel signal obtained by canceling a dark-time signal to the outside.

Figure 2:
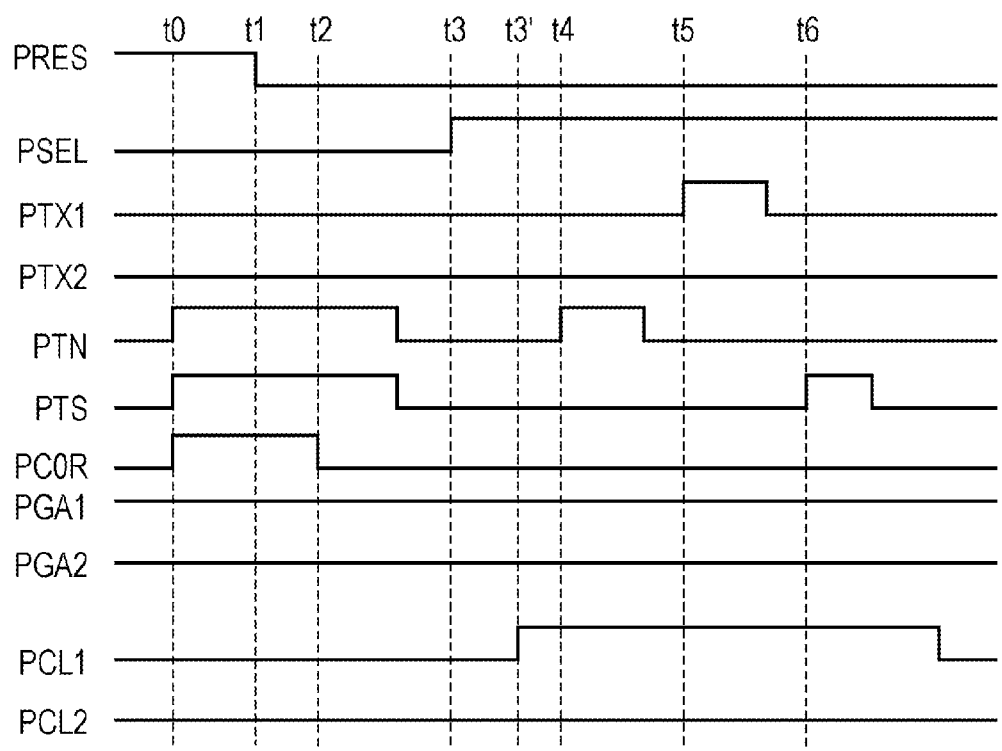
FIG. 2 is a drive timing chart of the solid-state image pickup device according to the first embodiment.

FIG. 2 is a timing chart illustrating an exemplary operation of the solid-state image pickup device illustrated in FIG. 1. At time to, the level of the clamp pulse PC0R is changed to be high, so that the clamp switch 24 is turned on. Accordingly, the amplifying circuit unit 8 comes into a voltage following state, and the voltage at the node on the inverting amplifier 10 side of the clamp capacitor C0 becomes almost equal to VC0R. At this time, the levels of signals PTN and PTS are changed from low to high. Accordingly, the control switches 12 and 13 are simultaneously turned on, and a potential that is almost equal to VC0R is written into the storage capacitors Ctn and Cts.

At time t1, the level of a signal PRES is changed from high to low. Accordingly, the reset MOS 5 is turned off, and resetting of the gate of the SFMOS 4 is canceled. At this time, the potential at the gate of the SFMOS 4 is floating.

At time t2, the level of the clamp pulse PC0R is changed from high to low, so that the clamp switch 24 is turned off. After that, the levels of the signals PTN and PTS are changed to be low, so that the control switches 12 and 13 are turned off. After that, the storage capacitors Ctn and Cts store signals.

At time t3, the level of a gate signal PSEL is changed to be high, so that the row-selection MOS 6 is turned on. Accordingly, a dark-time output appears in the vertical output line 7 and is clamped by the clamp capacitor C0.

At time t3', the level of a signal PCL1 is changed from low to high. Accordingly, the control switch 16 is turned on, and the output node of the amplifying circuit unit 8 is connected to the load capacitor Cl1.

At time t4, the level of the signal PTN is changed to be high. Accordingly, the control switch 12 is turned on, and the storage capacitor Ctn stores a dark-time signal.

From time t5, a signal PTX1 is kept at a high level for a certain period. Accordingly, the transfer MOS 3a is in an ON state for the certain period, and the charge stored in the photoelectric conversion element 2a is transferred to the input node of the SFMOS 4.

At time t6, the level of the signal PTS is changed to be high. Accordingly, the control switch 13 is turned on, and the storage capacitor Cts stores a signal obtained by superimposing a photoelectric conversion signal on a dark-time signal. At this time, the potential at the output node of the amplifying circuit unit 8 is determined in accordance with the voltage division ratio of the clamp capacitor C0 to the feedback capacitor Cf1 or Cf2. In this embodiment, the levels of signals PGA1 and PGA2 are high, and thus the amplification factor selection switches 21 and 22 are in an ON state, and the amplification factor of the amplifying circuit unit 8 is C0/(Cf1+Cf2). At time t3' and thereafter, the signal PCL1 causes the control switch 16 to be in an ON state during the period in which the control switch 12 is in an ON state due to the signal PTN and the period in which the control switch 13 is in an ON state due to the signal PTS.

Figure 3:
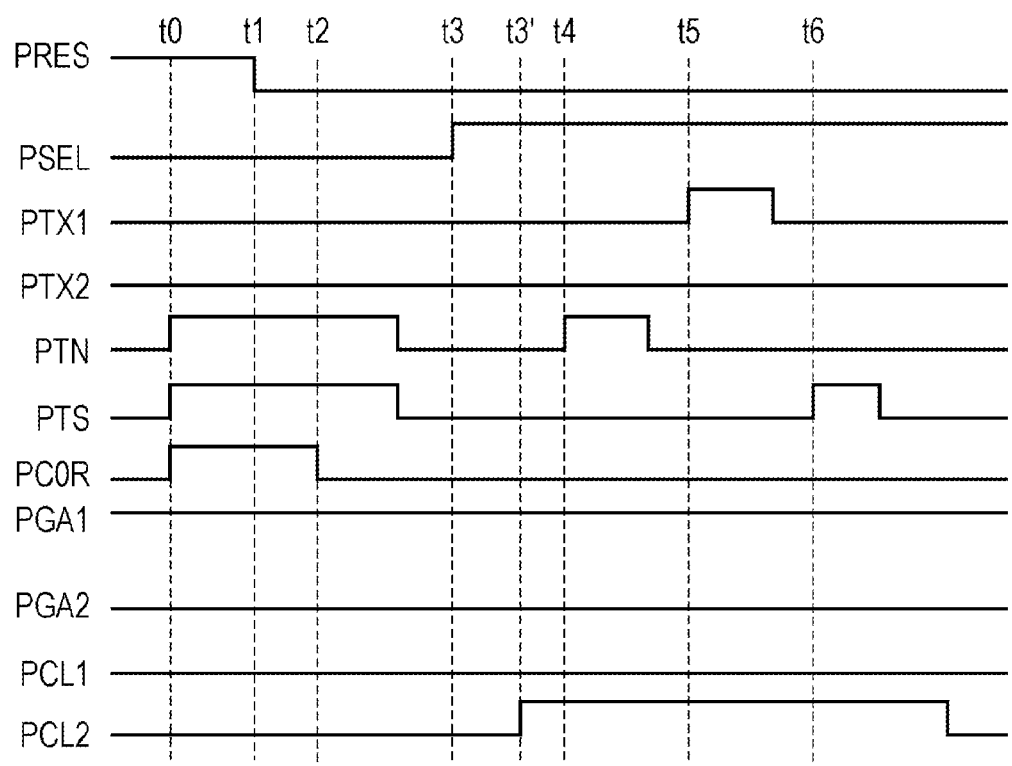
FIG. 3 is another drive timing chart of the solid-state image pickup device according to the first embodiment.

FIG. 3 is a timing chart illustrating another exemplary operation of the solid-state image pickup device illustrated in FIG. 1. In the case of changing and using the amplification factor of the amplifying circuit unit 8 in another mode, the capacitance value of the load capacitor connected to the output node of the amplifying circuit unit 8 is changed. Hereinafter, the points different from the timing chart in FIG. 2 will be described with reference to FIG. 3. When the level of the signal PGA1 is changed to be high, the amplification factor selection switch 21 is turned on. When the level of the signal PGA2 is changed to be low, the amplification factor selection switch 22 is turned off. Accordingly, the amplification factor of the amplifying circuit unit 8 is C0/(Cf1). At time t3', the level of the signal PCL2 is changed to be high, so that the control switch 17 is turned on, and that the output node of the amplifying circuit unit 8 is connected to the load capacitor Cl2. Other than the points described above, the timing chart in FIG. 3 is the same as that in FIG. 2. That is, the load capacitors Cl1 and Cl2 operate to narrow the gain band of the inverting amplifier 10 during a readout period.

Figure 4:
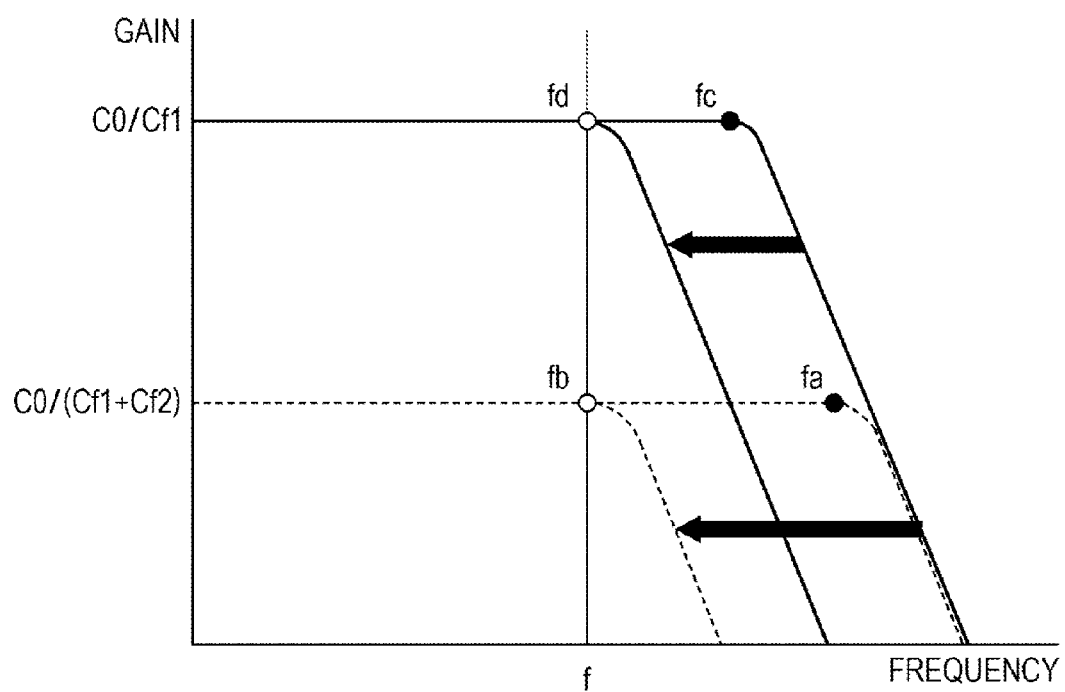
FIG. 4 is a diagram illustrating a gain-to-frequency characteristic of the solid-state image pickup device according to the first embodiment.

Referring to FIG. 4, a manner of limiting the gain band of the inverting amplifier 10 will be described. The drive frequency in normal use is represented by f, the transmission conductance of the inverting amplifier 10 is represented by gm, and the relationship between the load capacitors Cl1 and Cl2 is represented by Cl1>Cl2. When the amplification factor of the amplifying circuit unit 8 according to the timing chart in FIG. 2 is C0/(Cf1+Cf2) and when the load capacitor Cl1 is not connected, the frequency band of the amplifying circuit unit 8 during a readout period for reading out a signal to the storage capacitor Ctn is represented by fa with a black circle on a broken line and is expressed by the following equation.

$$fa=gm/(2\Pi \times C0/(Cf1+Cf2)\times Ctn)$$

Likewise, the frequency band of the amplifying circuit unit 8 during a readout period for reading out a signal to the storage capacitor Cts is represented by fa with the black circle on the broken line and is expressed by the following equation.

$$fa=gm/(2\Pi \times C0/(Cf1+Cf2)\times Cts)$$

When the level of the signal PCL1 is changed to be high, the control switch 16 is turned on, and the output node of the amplifying circuit unit 8 is connected to the load capacitor Cl1. In this case, the frequency band of the amplifying circuit unit 8 during a readout period for reading out a signal to the storage capacitor Ctn is represented by fb with a white circle on the broken line and is expressed by the following equation.

$$fb=gm/(2\Pi \times C0/(Cf1+Cf2)\times (Ctn+Cl1))$$

Likewise, the frequency band of the amplifying circuit unit 8 during a readout period for reading out a signal to the storage capacitor Cts is represented by fb with the white circle on the broken line and is expressed by the following equation.

$$fb=gm/(2\Pi \times C0/(Cf1+Cf2)\times (Cts+Cl1))$$

Since fb<fa, the frequency band of the amplifying circuit unit 8 is limited by the load capacitor Cl1.

On the other hand, when the amplification factor of the amplifying circuit unit 8 according to FIG. 3 is C0/(Cf1) and when the load capacitor Cl1 is not connected, the frequency band of the amplifying circuit unit 8 during a readout period for reading out a signal to the storage capacitor Ctn is represented by fc with a black circle on a solid line and is expressed by the following equation.

$$fc=gm/(2\Pi \times C0/(Cf1)\times Ctn)$$

Likewise, the frequency band of the amplifying circuit unit 8 in a readout period for reading out a signal to the storage capacitor Cts is represented by fc with the black circle on the solid line and is expressed by the following equation.

$$fc=gm/(2\Pi \times C0/(Cf1)\times Cts)$$

When the level of the signal PCL2 is changed to be high, the control switch 17 is turned on, and the output node of the amplifying circuit unit 8 is connected to the load capacitor Cl2. In this case, the frequency band of the amplifying circuit unit 8 in a readout period for reading out a signal to the storage capacitor Ctn is represented by fd with a white circle on the solid line and is expressed by the following equation.

$$fd=gm/(2\Pi \times C0/(Cf1)\times (Ctn+Cl2))$$

Likewise, the frequency band of the amplifying circuit unit 8 during a readout period for reading out a signal to the storage capacitor Cts is represented by fd with the white circle on the solid line and is expressed by the following equation.

$$fd=gm/(2\Pi \times C0/(Cf1)\times (Cts+Cl2))$$

Since fd<fc, the frequency band of the amplifying circuit unit 8 is limited by the load capacitor Cl1. At this time, it is the most appropriate to perform setting so that f=fb=fd is satisfied in order to reduce random noise in the amplifying circuit unit 8. That is, when it is assumed that the frequency necessary for driving is f, it is the most appropriate to perform designing so that f=fb=fd is satisfied in order to minimize noise.

According to the description given above, the load capacitors Cl1 and Cl2 are connected as a band limitation unit for the amplifying circuit unit 8, but embodiments of the present invention is not limited thereto. For example, the ON resistance of a transistor having a resistor element and a control electrode may be used. It is desired to appropriately apply a band limitation unit in view of a layout area and so forth. Also, it is desired to appropriately set the number of elements of the band limitation unit.

According to the first embodiment, when the amplifying circuit unit 8 operates with a first gain, a load capacitor having a first capacitance value is connected to the output node of the amplifying circuit unit 8. When the amplifying circuit unit 8 operates with a second gain, which is higher than the first gain, a load capacitor having a capacitance value smaller than the first capacitance value is connected to the output node of the amplifying circuit unit 8. This may also be applied to the other embodiments.

Second Embodiment

Figure 5:
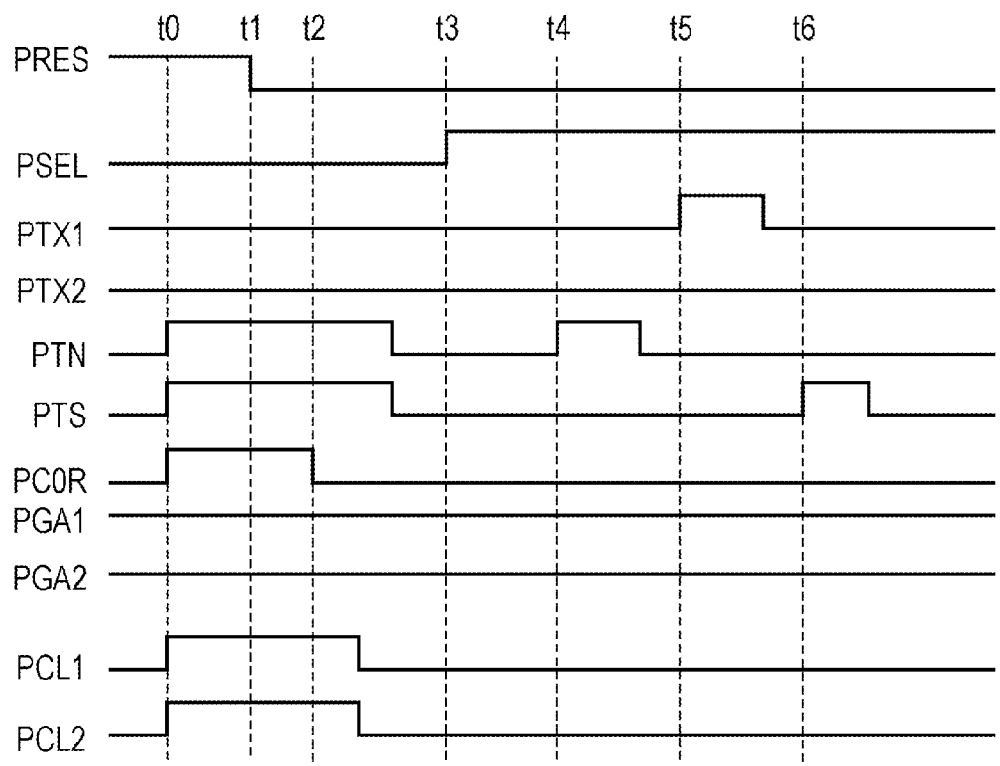
FIG. 5 is a drive timing chart of the solid-state image pickup device according to the second embodiment.

Hereinafter, a description will be given of a solid-state image pickup device according to a second embodiment of the present invention and a method for driving the solid-state image pickup device. The circuit diagram of the solid-state image pickup device according to the second embodiment is the same as that illustrated in FIG. 1 according to the first embodiment. FIG. 5 is a timing chart illustrating an exemplary operation of the solid-state image pickup device (FIG. 1) according to the second embodiment. The timing chart in FIG. 5 is different from the timing chart in FIG. 2 regarding the signals PCL1 and PCL2. Hereinafter, the points different from the timing chart in FIG. 2 will be described with reference to FIG. 5. The amplification factor of the amplifying circuit unit 8 is the same as that in FIG. 2, that is, C0/(Cf1+Cf2). At time t0, the levels of the signals PCL1 and PCL2 are changed to be high. Accordingly, the control switches 16 and 17 are turned on, and the output node of the amplifying circuit unit 8 is connected to the load capacitors Cl1 and Cl2. At the same time (at time t0), as in FIG. 2, the level of the clamp pulse PC0R is changed to be high, so that the clamp switch 24 is turned on. Accordingly, the feedback capacitors Cf1 and Cf2 are reset, the amplifying circuit unit 8 comes into a voltage following state, and the voltage at the node on the inverting amplifier 10 side of the clamp capacitor C0 becomes almost equal to VC0R. At this time, the levels of the signals PTN and PTS are changed from low to high, so that the control switches 12 and 13 are simultaneously turned on, and that a potential that is almost equal to VC0R is written into the storage capacitors Ctn and Cts. Then, after time t2, the levels of the signals PCL1 and PCL2 are changed to be low. Accordingly, the control switches 16 and 17 are turned off, and the load capacitors Cl1 and Cl2 are disconnected from the output node of the amplifying circuit unit 8. During a period in which the signal PC0R causes the feedback capacitors Cf1 and Cf2 to be reset, the control switches 16 and 17 are in an ON state due to the signals PCL1 and PCL2.

Also, in the case of changing the amplification factor of the amplifying circuit unit 8 by using the signals PGA1 and PGA2 in another mode, both the control switches 16 and 17 are turned on using the signals PLC1 and PCL2 regardless of the amplification factor of the amplifying circuit unit 8 at time t0 at which the reference potential is written. Accordingly, the output node of the amplifying circuit unit 8 is connected to the load capacitors Cl1 and Cl2.

Most of the random noise components generated at time t0 at which the reference potential is written are erased through correlated double sampling (CDS), which is a differential operation of the output amplifier 20. However, the random noise components are not completely erased. Thus, the random noise components are reduced by limiting the band at time t0 at which the reference potential is written, whereby residual noise after CDS can be reduced.

Figure 6:
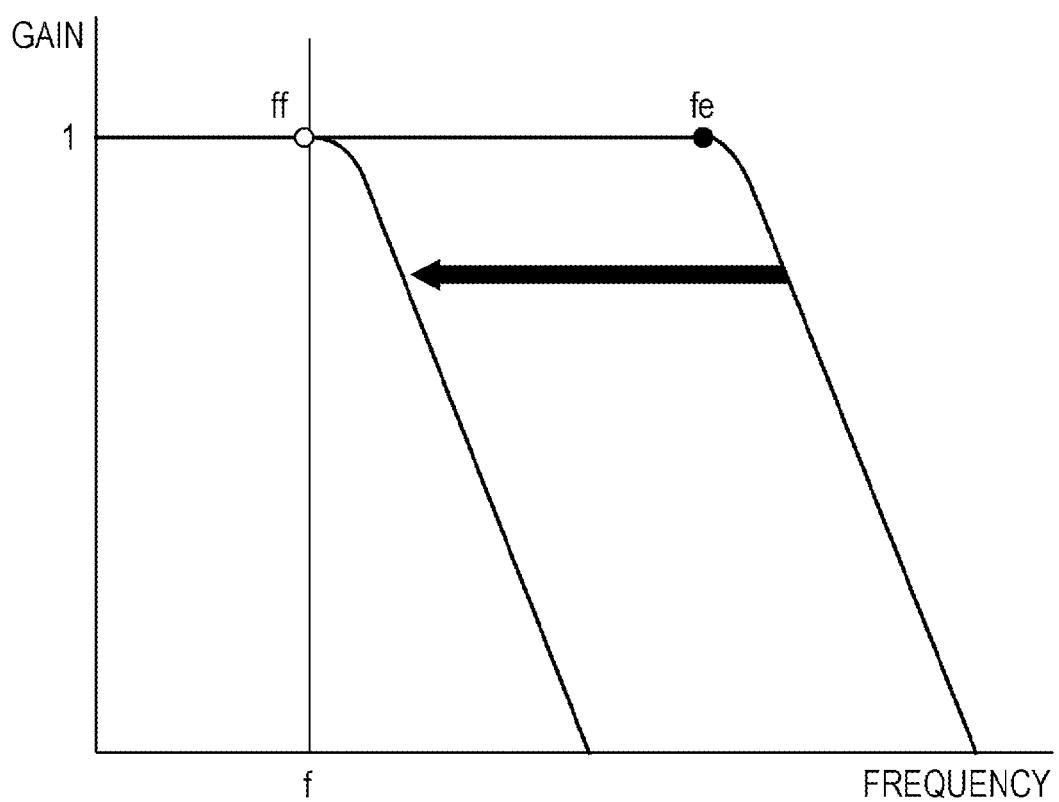
FIG. 6 is a diagram illustrating a gain-to-frequency characteristic of the solid-state image pickup device according to the second embodiment.

FIG. 6 illustrates an amplification factor (gain)-to-frequency characteristic. The amplification factor of the amplifying circuit unit 8 is 1 at time t0 at which the reference potential is written. Thus, the frequency band of the amplifying circuit unit 8 is represented by fe with a black circle and is expressed by the following equation.

$$fe = gm/(2\Pi \times Cts)$$

When the levels of the signals PCL1 and PCL2 are changed to be high, the control switches 16 and 17 are turned on, and the output node of the amplifying circuit unit 8 is connected to the load capacitors Cl1 and Cl2. In this case, the frequency band is represented by ff with a white circle and is expressed by the following equation.

$$ff = gm/(2\Pi \times (Cl1 + Cl2 + Cts))$$

By determining the load capacitors Cl1 and Cl2 so that f=ff is satisfied, noise components can be minimized while maintaining a necessary band. In the description given above, the load capacitors Cl1 and Cl2 are connected as a band limitation unit for the amplifying circuit unit 8, but embodiments of the present invention is not limited thereto. For example, the ON resistance of a transistor having a resistor element and a control electrode may be used. It is desired to appropriately apply a band limitation unit in view of a layout area and so forth. Also, it is desired to appropriately set the number of elements of the band limitation unit.

Third Embodiment

Figure 7:
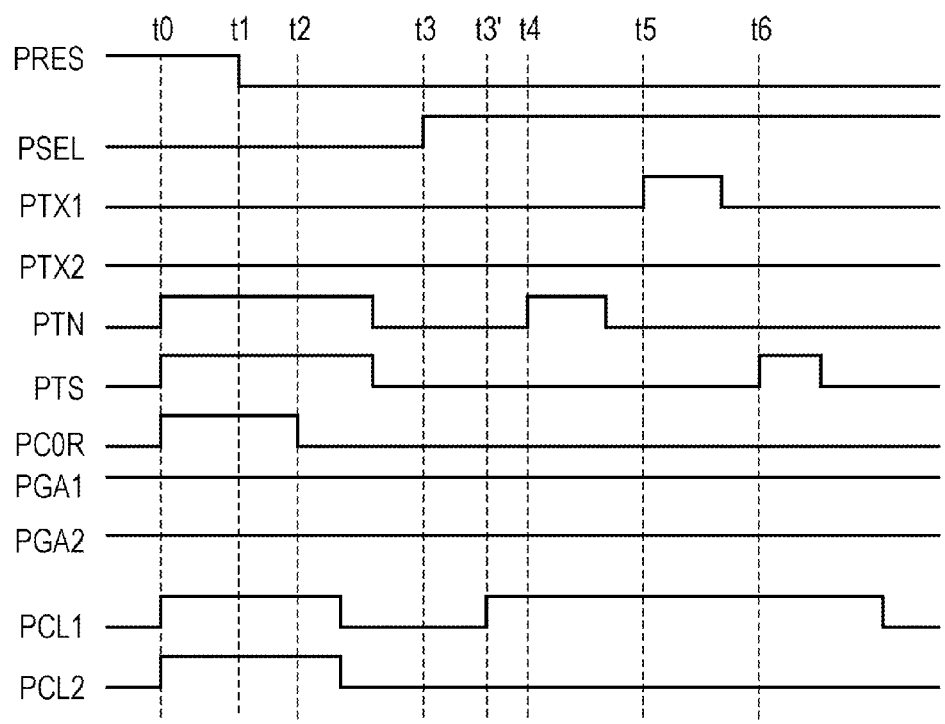
FIG. 7 is a drive timing chart of the solid-state image pickup device according to the third embodiment.

A solid-state image pickup device according to a third embodiment of the present invention is realized by combining the first and second embodiments. The circuit diagram of the solid-state image pickup device according to the third embodiment is the same as that illustrated in FIG. 1. FIG. 7 is a timing chart illustrating an exemplary operation of the solid-state image pickup device according to the third embodiment. The timing chart in FIG. 7 is different from the timing chart in FIG. 5 regarding the signal PCL1. Hereinafter, the points different from the timing chart in FIG. 5 will be described with reference to FIG. 7. As in FIG. 2, at time t3' after time t3, the level of the signal PCL1 is changed to be high again. Accordingly, the control switch 16 is turned on, and the output node of the amplifying circuit unit 8 is connected to the load capacitor Cl1. Then, after time t6, the level of the signal PCL1 is changed to be low. Accordingly, the control switch 16 is turned off, and the load capacitor Cl1 is disconnected from the output node of the amplifying circuit unit 8. During the period from time t0 to time t2, when the feedback capacitors Cf1 and Cf2 are reset, the control switches 16 and 17 are in an ON state due to the signals PCL1 and PCL2. Furthermore, at time t3' and thereafter, the control switch 16 is in an ON state due to the signal PCL1 during the period in which the control switch 12 is in an ON state due to the signal PTN and the period in which the control switch 13 is in an ON state due to the signal PTS.

In the description given above, the load capacitors Cl1 and Cl2 are connected as a band limitation unit for the amplifying circuit unit 8, but embodiments of the present invention is not limited thereto. For example, the ON resistance of a transistor having a resistor element and a control electrode may be used. It is desired to appropriately apply a band limitation unit in view of a layout area and so forth. Also, it is desired to appropriately set the number of elements of the band limitation unit.

According to this embodiment, random noise generated at a reset operation of the amplifying circuit unit 8 can be reduced, and also random noise generated when the amplification factor is high can be reduced. In the first to third embodiments, the control switches 16 and 17 are in an ON state during any one of or both of the period in which the feedback capacitors Cf1 and Cf2 are reset and the periods in which the control switches 12 and 13 are in an ON state, respectively.

Fourth Embodiment

Figure 8:
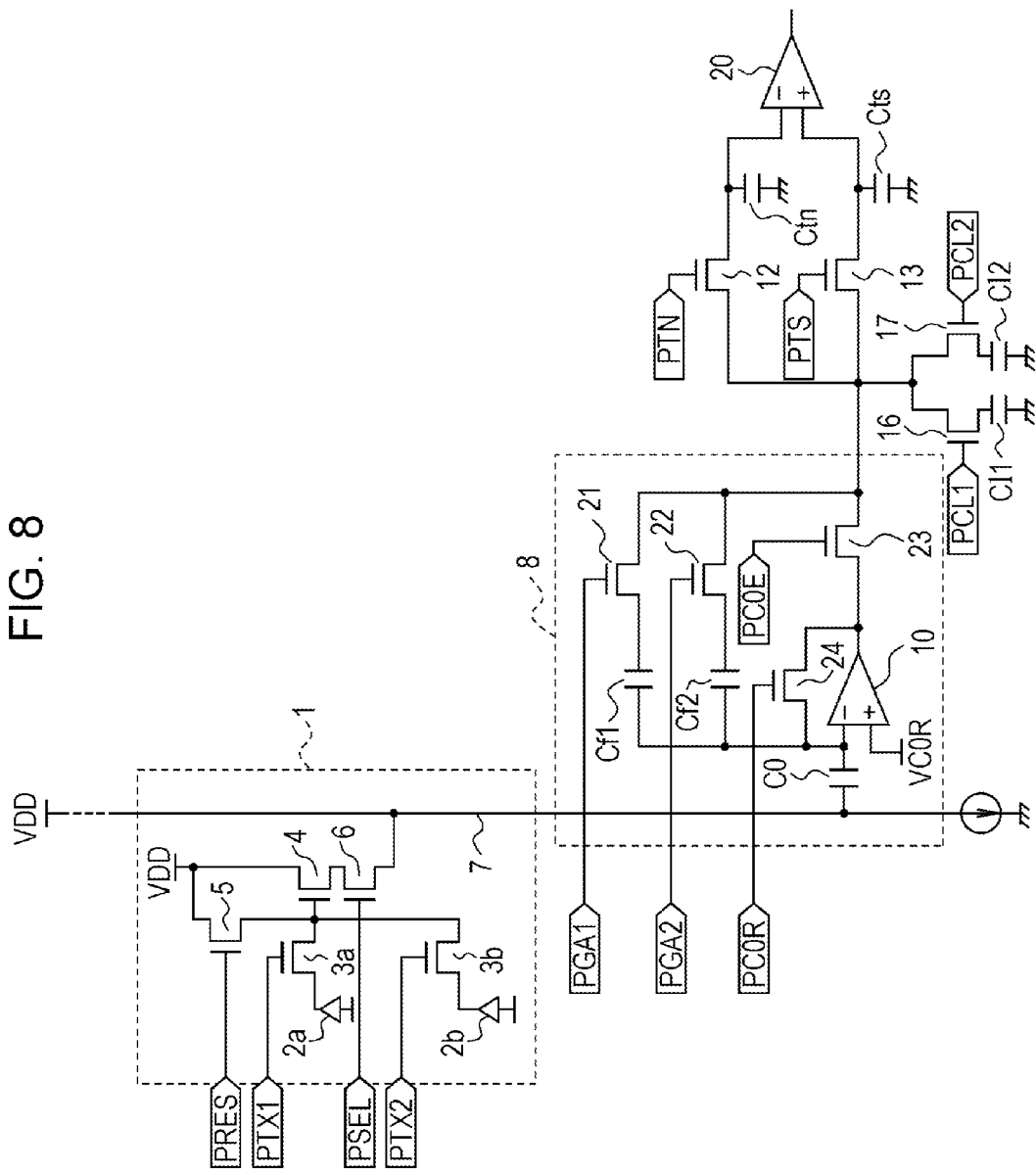
FIG. 8 is an equivalent circuit diagram of a solid-state image pickup device according to fourth to seventh embodiments of the present invention.

Hereinafter, a description will be given of a solid-state image pickup device according to a fourth embodiment of the present invention and a method for driving the solid-state image pickup device. In this embodiment, a description will be given of an exemplary operation in the case of adding signals of two pixels. FIG. 8 is a circuit diagram of the solid-state image pickup device according to the fourth embodiment. The solid-state image pickup device illustrated in FIG. 8 is different from the solid-state image pickup device illustrated in FIG. 1 in that an adding control switch 23 is provided. In the amplifying circuit unit 8, the adding control switch 23 may be realized by a MOS transistor in which the drain is connected to the output node of the inverting amplifier 10, the gate is connected to the node of a signal PC0E, and the source is connected to a connection point of the switches 12, 13, 16, 17, 21, and 22.

Figure 9:
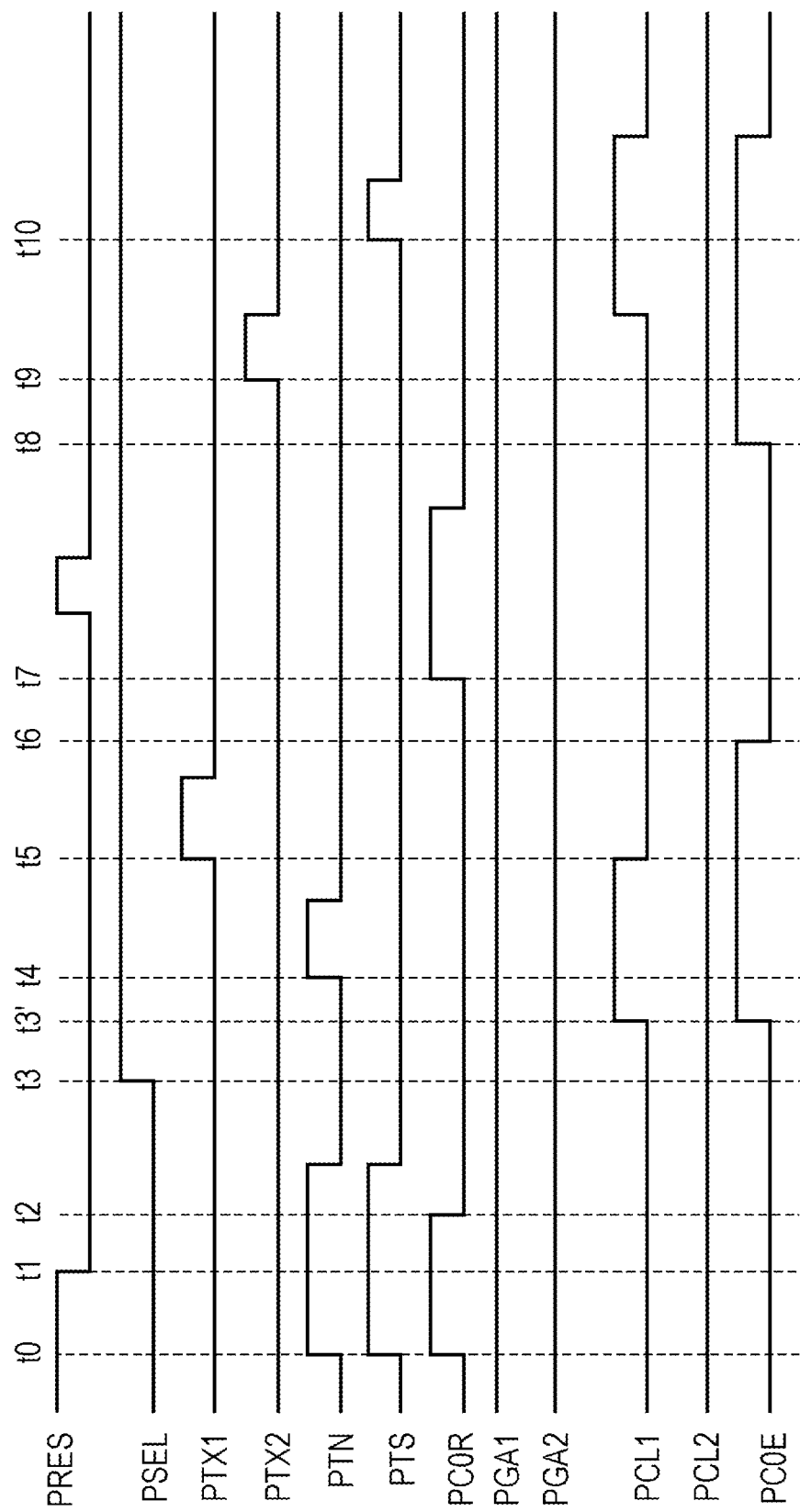
FIG. 9 is a drive timing chart of the solid-state image pickup device according to the fourth embodiment.

FIG. 9 is a timing chart illustrating an exemplary operation of the solid-state image pickup device illustrated in FIG. 8. At time to, the level of the clamp pulse PC0R is changed to be high. Accordingly, the clamp switch 24 is turned on, the amplifying circuit unit 8 comes into a voltage following state, and the voltage at the node on the inverting amplifier 10 side of the clamp capacitor C0 becomes almost equal to VC0R. At this time, the levels of the signals PTN and PTS are changed to be high, so that the control switches 12 and 13 are simultaneously turned on. Accordingly, a voltage that is almost equal to VC0R is written into the storage capacitors Ctn and Cts.

At time t1, the level of the signal PRES is changed from high to low. Accordingly, the reset MOS 5 is turned off, and resetting of the gate of the SFMOS 4 is canceled. The gate potential of the SFMOS 4 becomes floating.

At time t2, the level of the clamp pulse PC0R is changed from high to low, so that the clamp switch 24 is turned off. After that, the levels of the signals PTN and PTS are changed to be low, and the control switches 12 and 13 are turned off.

At time t3, the level of the signal PSEL is changed to be high. Accordingly, the row-selection MOS 6 is turned on, and a dark-time output appears in the vertical output line 7 and is clamped by the clamp capacitor C0.

At time t3', the levels of the signals PCL1 and PC0E are changed to be high. As a result of changing the level of the signal PCL1 to be high, the control switch 16 is turned on, and the load capacitor Cl1 is connected to the output node of the amplifying circuit unit 8. Also, as a result of changing the level of the signal PC0E to be high, the adding control switch 23 is turned on, and the output node of the inverting amplifier 10 is connected to the connection point of the switches 12, 13, 16, 17, 21, and 22.

At time t4, the level of the signal PTN is changed to be high. Accordingly, the control switch 12 is turned on, and the storage capacitor Ctn stores a dark-time signal, which is a reset signal of the SFMOS 4 and the inverting amplifier 10.

From time t5, the transfer signal PTX1 in the first row is kept at a high level for a certain period. Accordingly, the transfer MOS 3a in the first row is in an ON state for the certain period, and the charge stored in the photoelectric conversion element 2a is transferred to the input node of the SFMOS 4. This operation causes the signal transmitted from the photoelectric conversion element 2a to be stored in the feedback capacitors Cf1 and Cf2.

At time t6, the level of the signal PC0E is changed to be low. Accordingly, the adding control switch 23 is turned off, and the output node of the inverting amplifier 10 is disconnected from the feedback capacitors Cf1 and Cf2.

At time t7, the level of the clamp pulse PC0R is changed to be high, so that the clamp switch 24 is turned on. Accordingly, the amplifying circuit unit 8 comes into a voltage following state, the voltages at the nodes on the inverting amplifier 10 side of the clamp capacitor C0 and the feedback capacitors Cf1 and Cf2 become almost equal to VC0R, and the clamp capacitor (input capacitor) C0 is reset. After that, the signal PRES is kept at a high level for a certain period, the reset MOS 5 is in an ON state for the certain period, and the gate of the SFMOS 4 is reset. After that, the level of the clamp pulse PC0R is changed to be low, so that the clamp switch 24 is turned off.

At time t8, the level of the signal PC0E is changed to be high again, so that the adding control switch 23 is turned on.

From time t9, the transfer signal PTX2 in the second row is kept at a high level for a certain period. Accordingly, the transfer MOS 3b in the second row is in an ON state for the certain period, and the charge stored in the photoelectric conversion element 2b is transferred to the input node of the SFMOS 4. Due to this operation, signals of two pixels are added to the signal transmitted from the photoelectric conversion element 2b in the feedback capacitors Cf1 and Cf2. After that, the level of the signal PCL1 is changed to be high, so that the control switch 16 is turned on, and that the load capacitor Cl1 is connected to the output node of the amplifying circuit unit 8.

At time t10, the level of the signal PTS is changed to be high. Accordingly, the control switch 13 is turned on, and the storage capacitor Cts stores a signal obtained by superimposing the photoelectric conversion signals of two pixels on a dark-time signal.

The signals PGA1 and PGA2 are at a high level, and thus the amplification factor of the amplifying circuit unit 8 is C0/(Cf1+Cf2). The control switch 16 is turned on using the signal PCL1 in synchronization with the timing of writing a signal into the storage capacitor Ctn using the signal PTN and the timing of writing a signal into the storage capacitor Cts using the signal PTS, so that the output node of the amplifying circuit unit 8 is connected to the load capacitor Cl1. The amplifying circuit unit 8 sequentially receives, adds, and amplifies signals of the photoelectric conversion elements 2a and 2b from time t5 and time t9, and resets the clamp capacitor (input capacitor) C0 in a period from time t7 between the times when the signals of the photoelectric conversion elements 2a and 2b are received. The control switch 16 is in an ON state due to the signal PCL1 during the period in which the control switch 12 is in an ON state due to the signal PTN and the period in which the control switch 13 is in an ON state due to the signal PTS.

In the case of changing the amplification factor of the amplifying circuit unit 8 and using only the feedback capacitor Cf1, the amplification factor is C0/(Cf1). At this time, the signal PCL2 causes the control switch 17 to be turned on, and the output node of the amplifying circuit unit 8 is connected to the load capacitor Cl2, as in FIG. 3.

The band limitation of the amplifying circuit unit 8 in the above-described operation is the same as that illustrated in FIG. 4.

Fifth Embodiment

Hereinafter, a description will be given of a solid-state image pickup device according to a fifth embodiment of the present invention and a method for driving the solid-state image pickup device. A feature of this embodiment is that an operation of connecting a capacitor for limiting the band is performed at the time of a reset operation of the amplifying circuit unit 8, which is performed between readout of a first pixel and readout of a second pixel in the case of adding signals of two pixels. The circuit diagram of the solid-state image pickup device according to this embodiment is the same as that illustrated in FIG. 8.

Figure 10:
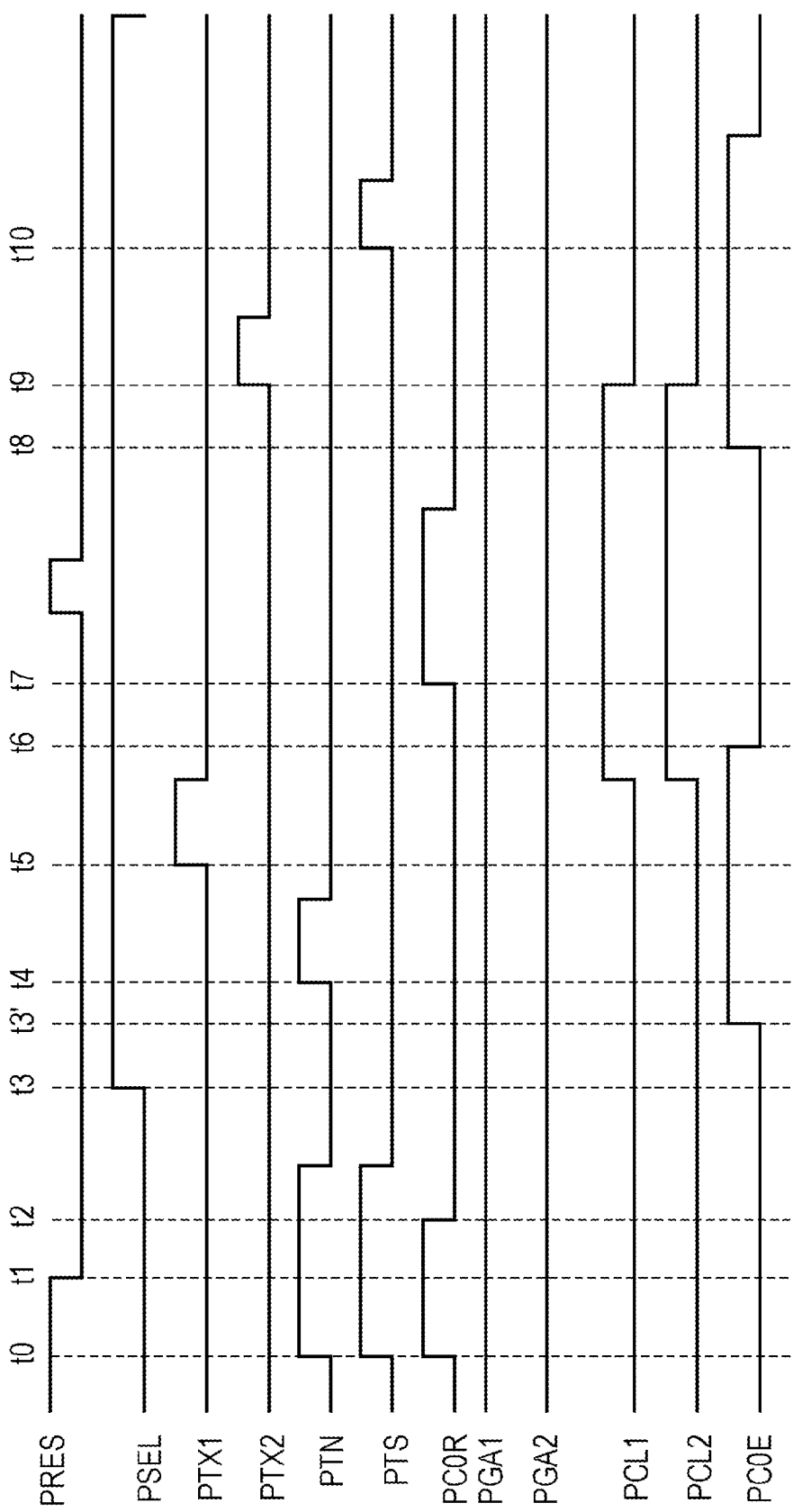
FIG. 10 is a drive timing chart of the solid-state image pickup device according to the fifth embodiment.

FIG. 10 is a timing chart illustrating an exemplary operation of the solid-state image pickup device according to this embodiment. The operations performed from time t0 to time t3 are the same as those in the fourth embodiment. At time t3' after time t3, the level of the signal PC0E is changed to be high, so that the adding control switch 23 is turned on. However, the control switches 16 and 17 remain in an OFF state.

At time t4, the level of the signal PTN is changed to be high, so that the control switch 12 is turned on, and that a dark-time signal is transferred to the storage capacitor Ctn.

From time t5, the signal PTX1 is kept at a high level for a certain period. Accordingly, the transfer MOS 3a of the first pixel is in an ON state, so that the signal of the first pixel is read out. After that, the levels of the signals PCL1 and PCL2 are changed to be high. Accordingly, the control switches 16 and 17 are turned on, and the load capacitors Cl1 and Cl2 are connected to the output node of the amplifying circuit unit 8.

At time t6, the level of the signal PC0E is changed to be low, so that the adding control switch 23 is turned off.

At time t7, the level of the signal PC0R is changed to be high, so that the clamp switch 24 is turned on. Accordingly, the feedback loop of the inverting amplifier 10 is short circuited, and the inverting amplifier 10 and the clamp capacitor (input capacitor) C0 are reset. In this state, the output node of the inverting amplifier 10 is connected to the load capacitors Cl1 and Cl2, and thus the band of the inverting amplifier 10 is narrowed, and noise is reduced. After that, the signal PRES is kept at a high level for a certain period, the reset MOS 5 is in an ON state for the certain period, and the gate of the SFMOS 4 is reset. After that, the level of the clamp pulse PC0R is changed to be low, so that the clamp switch 24 is turned off.

At time t8, the level of the signal PC0E is changed to be high, so that the adding control switch 23 is turned on.

From time t9, the transfer signal PTX2 in the second row is kept at a high level for a certain period. Accordingly, the transfer MOS 3b is in an ON state for the certain period, and the charge stored in the photoelectric conversion element 2b is transferred to the input node of the SFMOS 4. Accordingly, signals of two pixels are added to the signal transmitted from the photoelectric conversion element 2b in the feedback capacitors Cf1 and Cf2.

From time t10, the signal PTS is kept at a high level for a certain period, so that the control switch 13 is in an ON state for the certain period. Accordingly, the storage capacitor Cts stores a signal obtained by superimposing photoelectric conversion signals of two pixels on a dark-time signal.

Since the signals PGA1 and PGA2 are at a high level, the amplification factor of the amplifying circuit unit 8 is C0/(Cf1+Cf2). A description will be given of a noise generation situation in a case where no load capacitor is connected to the output node of the inverting amplifier 10 at the time of resetting performed between readout of a first row and readout of a second row. After a signal of the first row has been read out, the level of the adding control switch 23 is changed to be low. At the time when the output node of the inverting amplifier 10 is disconnected from the feedback capacitors Cf1 and Cf2, noise is fixed to the feedback capacitors Cf1 and Cf2 in accordance with the band of the inverting amplifier 10. After that, at the time when the level of the clamp pulse PC0R is changed to be low in the clamp switch 24, noise is fixed to the clamp capacitor C0 and the feedback capacitors Cf1 and Cf2 in accordance with the band.

The band of the inverting amplifier 10 is narrowed by connecting the load capacitors Cl1 and Cl2 to the output node of the inverting amplifier 10, so that noise is effectively reduced. The manner of limiting the band of the inverting amplifier 10 is the same as that illustrated in FIG. 6, and thus the description thereof is omitted. The amplifying circuit unit 8 sequentially receives, adds, and amplifies signals of the photoelectric conversion elements 2a and 2b from time t5 and time t9, and resets the clamp capacitor (input capacitor) C0 during a certain period from time t7 between the times when the signals of the photoelectric conversion elements 2a and 2b are input. The control switches 16 and 17 are in an ON state due to the signals PCL1 and PCL2 during the period in which the amplifying circuit unit 8 resets the clamp capacitor (input capacitor) C0.

The ON resistance of a transistor having a resistor element and a control electrode may be used instead of the load capacitors Cl1 and Cl2. It is desired to appropriately apply a band limitation unit in view of a layout area and so forth. Also, it is desired to appropriately set the number of elements of the band limitation unit.

Sixth Embodiment

Figure 11:
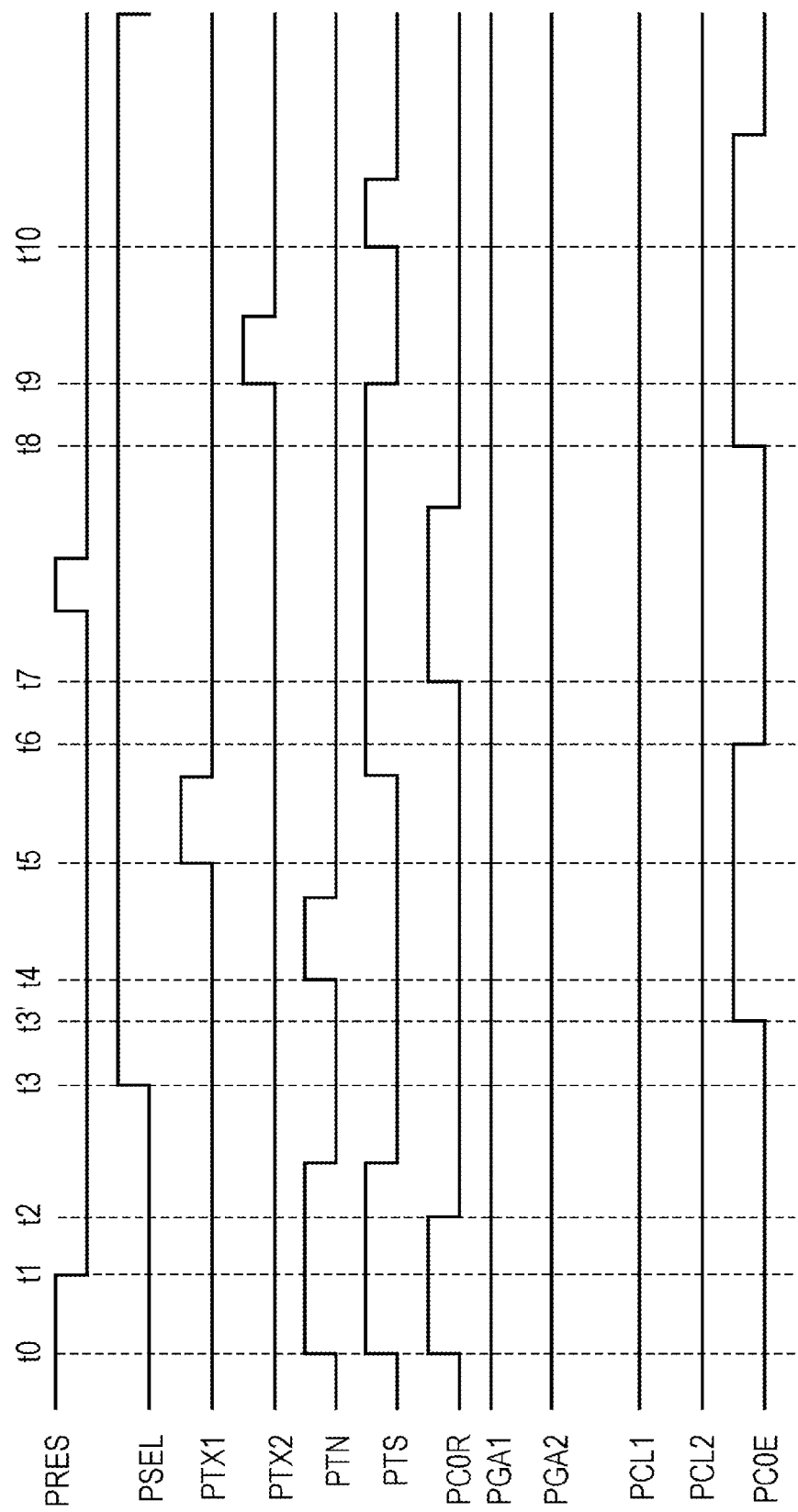
FIG. 11 is a drive timing chart of the solid-state image pickup device according to the sixth embodiment.

FIG. 11 is a drive timing chart of a solid-state image pickup device according to a sixth embodiment of the present invention. More specifically, FIG. 11 illustrates drive timings for obtaining a similar noise reduction effect by using the storage capacitors Ctn and Cts instead of the load capacitors Cl1 and Cl2. In this embodiment, the storage capacitors Ctn and Cts and the load capacitors Cl1 and Cl2 are common capacitors. The timing chart in FIG. 11 is different from the timing chart in FIG. 10 regarding the signal PTS. The signal PTS is at a high level during a period from before time t6 to time t9. Other than that, FIG. 11 is the same as FIG. 10, and thus the description thereof is omitted. In this embodiment, elements other than capacitor elements may be used as a band limitation unit, as in the other embodiments.

Seventh Embodiment

Figure 12:
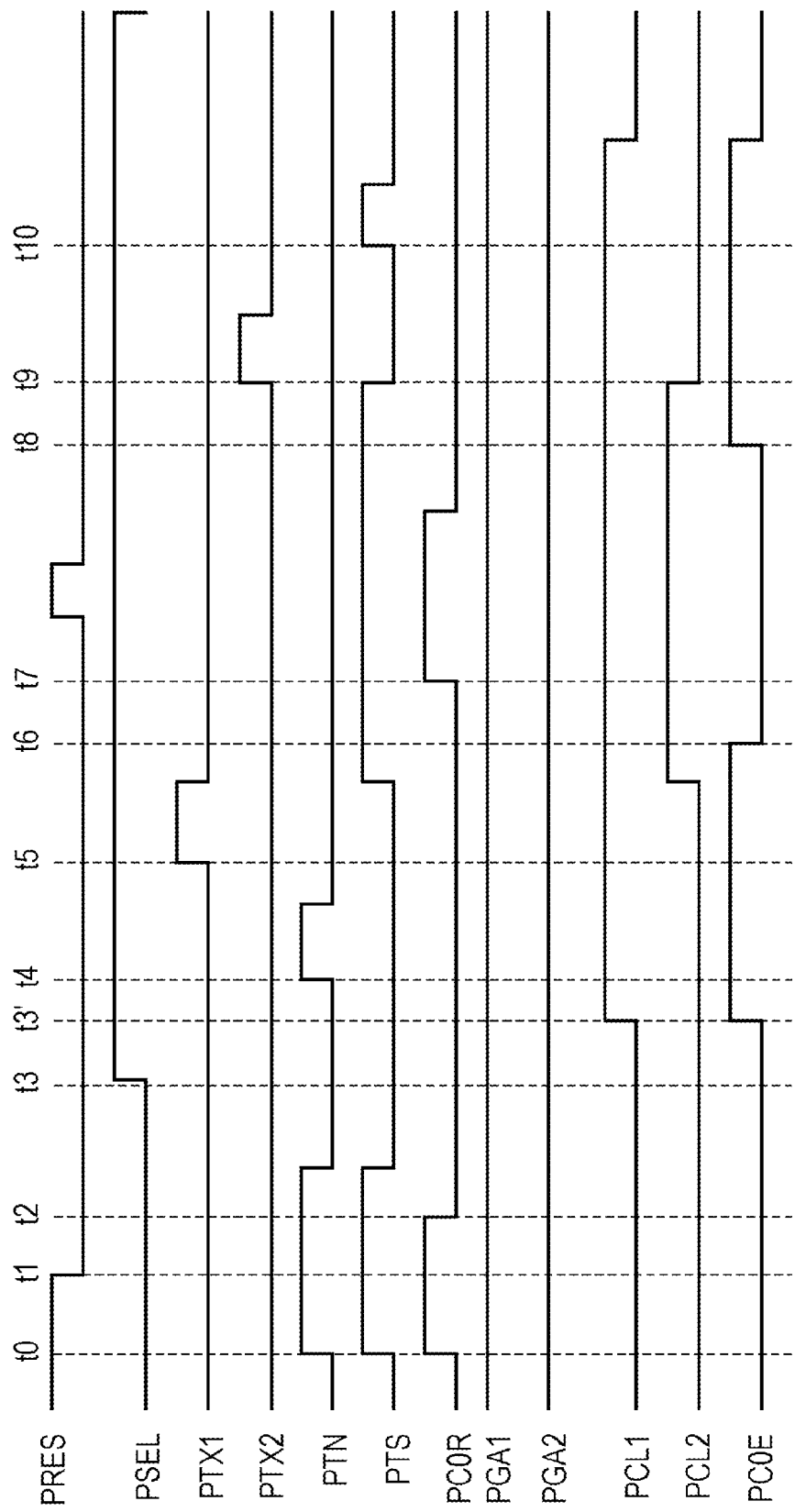
FIG. 12 is a drive timing chart of the solid-state image pickup device according to the seventh embodiment.

A seventh embodiment of the present invention is realized by combining the fourth to sixth embodiments. The circuit diagram of a solid-state image pickup device according to this embodiment is the same as that illustrated in FIG. 8. FIG. 12 is a drive timing chart according to the seventh embodiment. In FIG. 12, the differences from FIG. 10 are that the signal PCL1 is at a high level during a period from time t3' to after time t10 and that the signal PTS is at a high level during a period from before time t6 to time t9. With such driving, the load capacitors Cl1 and Cl2 and the storage capacitor Cts can be connected to the output node of the amplifying circuit unit 8 at the time of a reset operation of the amplifying circuit unit 8 performed between a readout period of a first pixel and a readout period of a second pixel. Accordingly, random noise generated in the amplifying circuit unit 8 can be effectively suppressed.

The amplifying circuit unit 8 sequentially receives, adds, and amplifies signals of the photoelectric conversion elements 2a and 2b from time t5 and time t9, and resets the clamp capacitor (input capacitor) C0 during a certain period from time t7 between the times when the signals of the photoelectric conversion elements 2a and 2b are input. The control switch 16 is in an ON state due to the signal PCL1 during both of a period from time t7 in which the amplifying circuit unit 8 resets the clamp capacitor (input capacitor) C0 and periods from time t4 and time t10 in which the control switches 12 and 13 are in an ON state, respectively. In the fourth to sixth embodiments, the control switches 16 and 17 are in an ON state during any one of or both of the period in which the amplifying circuit unit 8 resets the clamp capacitor (input capacitor) C0 and the periods in which the control switches 12 and 13 are in an ON state, respectively.

In the first to sixth embodiments, the control switches 16 and 17 switch between on and off in accordance with the amplification factor of the amplifying circuit unit 8 during the periods in which the control switches 12 and 13 are in an ON state, respectively. Specifically, the output node of the amplifying circuit unit 8 is connected to the load capacitors Cl1 and Cl2 via the control switches 16 and 17. The control switches 16 and 17 switch between on and off in accordance with the amplification factor of the amplifying circuit unit 8 during the periods in which the control switches 12 and 13 are in an ON state, respectively. The bandwidth of the amplifying circuit unit 8 can be controlled by changing the load capacitors Cl1 and Cl2 connected to the output node of the amplifying circuit unit 8 in accordance with the amplification factor of the amplifying circuit unit 8. Accordingly, random noise generated from the amplifying circuit unit 8 can be reduced and the S/N ratio can be improved.

The above-described embodiments are simply specific examples for carrying out the present invention, and the technical scope of the present invention should not be interpreted in a restrictive manner on the basis of such examples. The present invention can be carried out in various forms without deviating from the technical spirit thereof or main features thereof.

For example, an embodiment of the present invention may be applied to a configuration in which an AD converter is provided in each column. In this case, the AD converter may be provided so that the input node of the AD converter can be electrically connected to the output node of the amplifying circuit unit 8. Furthermore, a second storage capacitor may be provided in the subsequent stage of the storage capacitors Ctn and Cts via a switch. In this case, pixel signals of n+1 rows can be stored in the storage capacitors Ctn and Cts during a period in which a horizontal scanning circuit performs sequential scanning in a state where signals of certain rows (n rows) are stored in the second storage capacitor. Accordingly, the signal readout speed can be increased.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. Furthermore, the present invention has been described with constitution to connect capacity to the output node of the amplification circuit as load, but can substitute even resistance. In other words, a load element can generalize the load capacity of the present invention.

This application claims the benefit of Japanese Patent Application No. 2010-244263 filed Oct. 29, 2010, which is hereby incorporated by reference herein in its entirety.

What is claimed is:

1. A solid-state image pickup device comprising:
a pixel including a photoelectric conversion element;
an amplifying circuit configured to amplify a signal of the pixel and to have a variable amplification factor;
a storage capacitor connected to an output node of the amplifying circuit via a first switch; and
a load element connected to the output node of the amplifying circuit via a second switch,
wherein the second switch is in an on state during any one of or both of a period in which the amplifying circuit is reset and a period in which the first switch is in an on state.

2. The solid-state image pickup device according to claim 1, comprising a plurality of the pixels,
wherein the amplifying circuit includes an input capacitor,
wherein the amplifying circuit adds signals supplied from the plurality of pixels and resets the input capacitor during a period of receiving the signals supplied from the plurality of pixels, and
wherein the second switch is in an on state during any one of or both of a period in which the amplifying circuit resets the input capacitor and the period in which the first switch is in an on state.

3. The solid-state image pickup device according to claim 1,
wherein the second switch switches between on and off in accordance with the amplification factor of the amplifying circuit during the period in which the first switch is in an on state.

4. The solid-state image pickup device according to claim 1,
wherein the second switch comprises a plurality of second switches, and the load element comprises a plurality of load capacitors,
wherein the output node of the amplifying circuit is connected to the plurality of load capacitors via the plurality of second switches, and
wherein the plurality of second switches switch between on and off in accordance with the amplification factor of the amplifying circuit during the period in which the first switch is in an on state.

5. The solid-state image pickup device according to claim 1,
wherein the load element and the storage capacitor are common capacitors.

6. The solid-state image pickup device according to claim 1,
wherein a plurality of the pixels are arranged in a matrix, and the amplifying circuit is provided in each of pixel columns.

7. The solid-state image pickup device according to claim 1,
wherein the load element is any one of a load capacitor having a first capacitance value and a load capacitor having a capacitance value smaller than the first capacitance value, and
wherein the load capacitor having the first capacitance value is connected to the output node of the amplifying circuit when the amplifying circuit operates with a first gain, and the load capacitor having the capacitance value smaller than the first capacitance value is connected to the output node of the amplifying circuit when the amplifying circuit operates with a second gain, which is higher than the first gain.

* * * * *